(12) United States Patent
Derrickson et al.

(10) Patent No.: US 11,804,542 B2
(45) Date of Patent: Oct. 31, 2023

(54) ANNULAR BIPOLAR TRANSISTORS

(71) Applicant: GLOBALFOUNDRIES U.S. Inc., Malta, NY (US)

(72) Inventors: Alexander M. Derrickson, Saratoga Springs, NY (US); Arkadiusz Malinowski, Dresden (DE); Jagar Singh, Clifton Park, NY (US); Mankyu Yang, Fishkill, NY (US); Judson R. Holt, Ballston Lake, NY (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 51 days.

(21) Appl. No.: 17/557,176

(22) Filed: Dec. 21, 2021

(65) Prior Publication Data

US 2023/0063301 A1   Mar. 2, 2023

Related U.S. Application Data

(60) Provisional application No. 63/237,777, filed on Aug. 27, 2021.

(51) Int. Cl.
| | |
|---|---|
| *H01L 29/737* | (2006.01) |
| *H01L 29/165* | (2006.01) |
| *H01L 29/66* | (2006.01) |
| *H01L 29/10* | (2006.01) |
| *H01L 29/08* | (2006.01) |

(52) U.S. Cl.
CPC ...... *H01L 29/7371* (2013.01); *H01L 29/0817* (2013.01); *H01L 29/0821* (2013.01); *H01L 29/1004* (2013.01); *H01L 29/165* (2013.01); *H01L 29/66242* (2013.01)

(58) Field of Classification Search
CPC ............ H01L 29/7371; H01L 29/0817; H01L 29/0821; H01L 29/1004; H01L 29/165; H01L 29/66242
See application file for complete search history.

(56) References Cited

U.S. PATENT DOCUMENTS

| | | | |
|---|---|---|---|
| 8,809,957 B2 | 8/2014 | Bangsaruntip et al. | |
| 2010/0022056 A1* | 1/2010 | Donkers | ............ H01L 29/7378 438/207 |

FOREIGN PATENT DOCUMENTS

| | | |
|---|---|---|
| KR | 100960691 | 5/2010 |
| KR | 102158187 | 9/2020 |
| WO | 2010009873 | 1/2010 |
| WO | 2019223115 | 11/2019 |

* cited by examiner

*Primary Examiner* — Syed I Gheyas
(74) *Attorney, Agent, or Firm* — Francois Pagette; Andrew M. Calderon; Calderon Safran & Cole P.C.

(57) ABSTRACT

The present disclosure relates to semiconductor structures and, more particularly, to annular bipolar transistors and methods of manufacture. The structure includes: a substate material; a collector region parallel to and above the substrate material; an intrinsic base region surrounding the collector region; an emitter region above the intrinsic base region; and an extrinsic base region contacting the intrinsic base region.

20 Claims, 12 Drawing Sheets

ANNULAR BIPOLAR TRANSISTORS

BACKGROUND

The present disclosure relates to semiconductor structures and, more particularly, to annular bipolar transistors and methods of manufacture.

Bipolar transistors can be vertical transistors or lateral transistors. In a vertical bipolar transistor, carriers flow in a vertical direction. Since a collector region is formed in a position deep from a wafer surface, collector resistance increases, thus limiting the transistor performance especially for high-speed operation. In addition, the transistor requires a high-concentration buried layer, a collector epitaxial layer, and a deep trench isolation, etc. Consequently, the number of process steps increases and thus does the costs. On the other hand, the lateral bipolar transistor is simpler in structure than the vertical bipolar transistor. Also, in a lateral bipolar transistor, a collector electrode can be directly brought into contact with a collector region, which is advantageous for high-speed operation.

SUMMARY

In an aspect of the disclosure, a structure comprises: a substate material; a collector region parallel to and above the substrate material; an intrinsic base region surrounding the collector region; an emitter region above the intrinsic base region; and an extrinsic base region contacting the intrinsic base region.

In an aspect of the disclosure, a structure comprises: a collector region comprising a first semiconductor material and extending parallel to a surface of an underlying substrate; an intrinsic base region comprising a second semiconductor material and extending around the collector region; an extrinsic base region contacting the intrinsic base region and extending vertically upward from the underlying substrate; and an emitter region contacting the intrinsic base region and extending vertically upward from the underlying substrate.

In an aspect of the disclosure, a method comprises: forming a collector region parallel to and above a substrate material; forming an intrinsic base region surrounding the collector region; forming an emitter region above the intrinsic base region; and forming an extrinsic base region contacting the intrinsic base region.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to annular bipolar transistors and methods of manufacture. More specifically, the present disclosure relates to high performance annular bipolar transistors optimized for high Ft/Fmax and beta. Advantageously, the annular bipolar transistors are applicable in high voltage RF device applications with a low parasitic contact of base/collector/emitter and improved current spreading due to its annular shape.

In more specific embodiments, the annular bipolar transistors include an ultra-narrow base (Wb) comprising SiGe material. By way of example, Wb may be between about 1 nm to 15 nm, with a target Wb of about 10 nm to 15 nm. In embodiments, the annular bipolar transistors include a sheet of Si material which functions as a collector region (e.g., elongated collector), and an intrinsic base epitaxially grown around the collector region. The intrinsic base comprises a SiGe heterojunction. An emitter region may be epitaxially grown around the intrinsic base, with spacers separating the contact locations of the collector, emitter and base regions. In embodiments, the annular bipolar transistors may also function within a fin platform. Moreover, the annular bipolar transistors may be integrated within a BiCMOS integration scheme.

The annular bipolar transistors of the present disclosure can be manufactured in a number of ways using a number of different tools. In general, though, the methodologies and tools are used to form structures with dimensions in the micrometer and nanometer scale. The methodologies, i.e., technologies, employed to manufacture the annular bipolar transistors of the present disclosure have been adopted from integrated circuit (IC) technology. For example, the structures are built on wafers and are realized in films of material patterned by photolithographic processes on the top of a wafer. In particular, the fabrication of the annular bipolar transistors uses three basic building blocks: (i) deposition of thin films of material on a substrate, (ii) applying a patterned mask on top of the films by photolithographic imaging, and (iii) etching the films selectively to the mask. In addition, as is known in the art, precleaning processes may be used to clean etched surfaces of any contaminants, as is known in the art. Moreover, when necessary, a rapid thermal anneal processes may be used to drive-in dopants or material layers as is known in the art.

Figure 1:
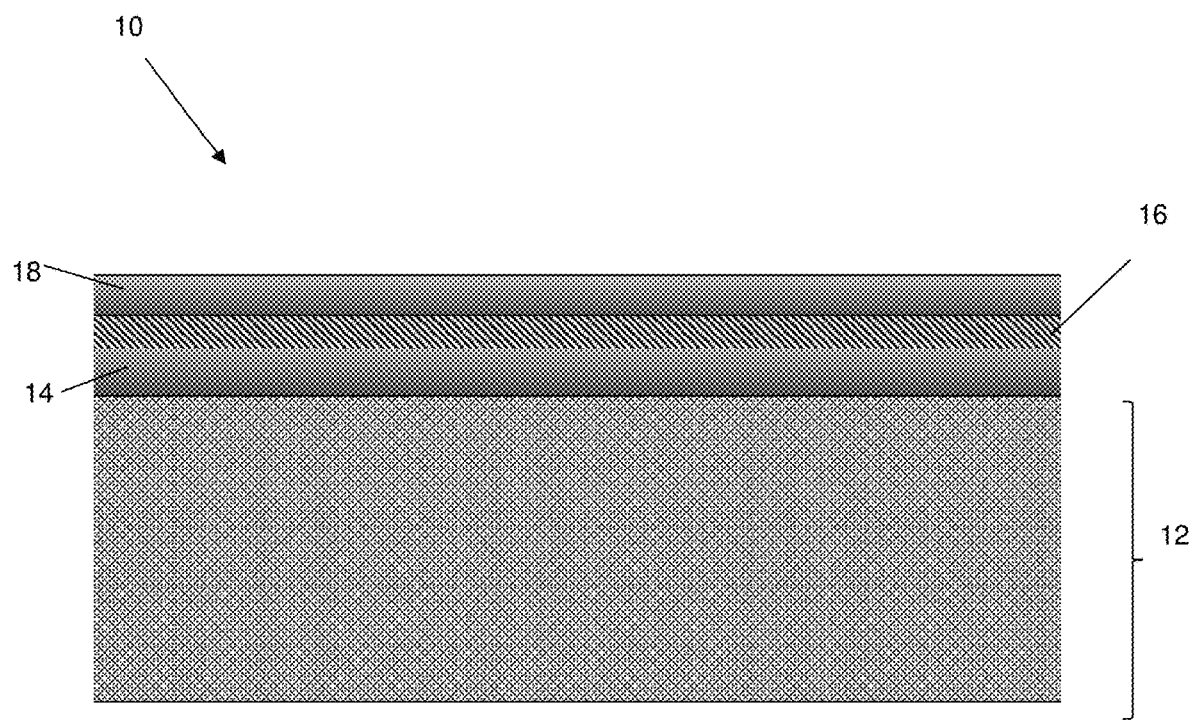
FIG. 1 shows a starting substrate, amongst other features, and respective fabrication processes in accordance with aspects of the present disclosure.

FIG. 1 shows a starting substrate in accordance with aspects of the present disclosure. In particular, the structure 10 of FIG. 1 includes a substrate 12 comprising any suitable semiconductor material including, but not limited to, Si, SiGe, SiGeC, SiC, GaAs, InAs, InP, and other II/VV or II/VI compound semiconductors. The substrate 12 may also be a P+ substrate. The substrate 12 may comprise any suitable crystallographic orientation (e.g., a (100), (110), (111), or (001) crystallographic orientation). In embodiments, the substrate 12 may be a bulk substrate or semiconductor-on-insulator (SOI) substrate.

Semiconductor material 14, 16, 18 may be formed on the substate 12. In embodiments, the semiconductor materials 14, 18 may be the same material, with the semiconductor material 16 being a different material. Moreover, the semiconductor materials 14, 18 may be different materials than the substrate 12. In this way, selective etching processes can be performed to remove the semiconductor materials 14, 18 during subsequent fabrication processes. In more specific embodiments, the semiconductor materials 14, 18 may be SiGe material and the semiconductor material 16 may be Si material. The semiconductor material 16 may be parallel to a top surface of the substrate 12 and may be used as a collector region of the bipolar transistor.

In embodiments, the semiconductor materials 14, 16, 18 may be epitaxially grown on the substate 12 using epitaxial processes as is known in the art such that no further explanation is required for a complete understanding of the present disclosure. Also, the epitaxial growth process of the semiconductor material 16 may include an in-situ doping using an n-type dopant, e.g., arsenic, phosphorus, Sb, etc. The dopants may be driven in by a rapid thermal anneal process as is known in the art. The semiconductor material 16 may have a thickness of about 10 nm to about 25 nm.

Figure 2:
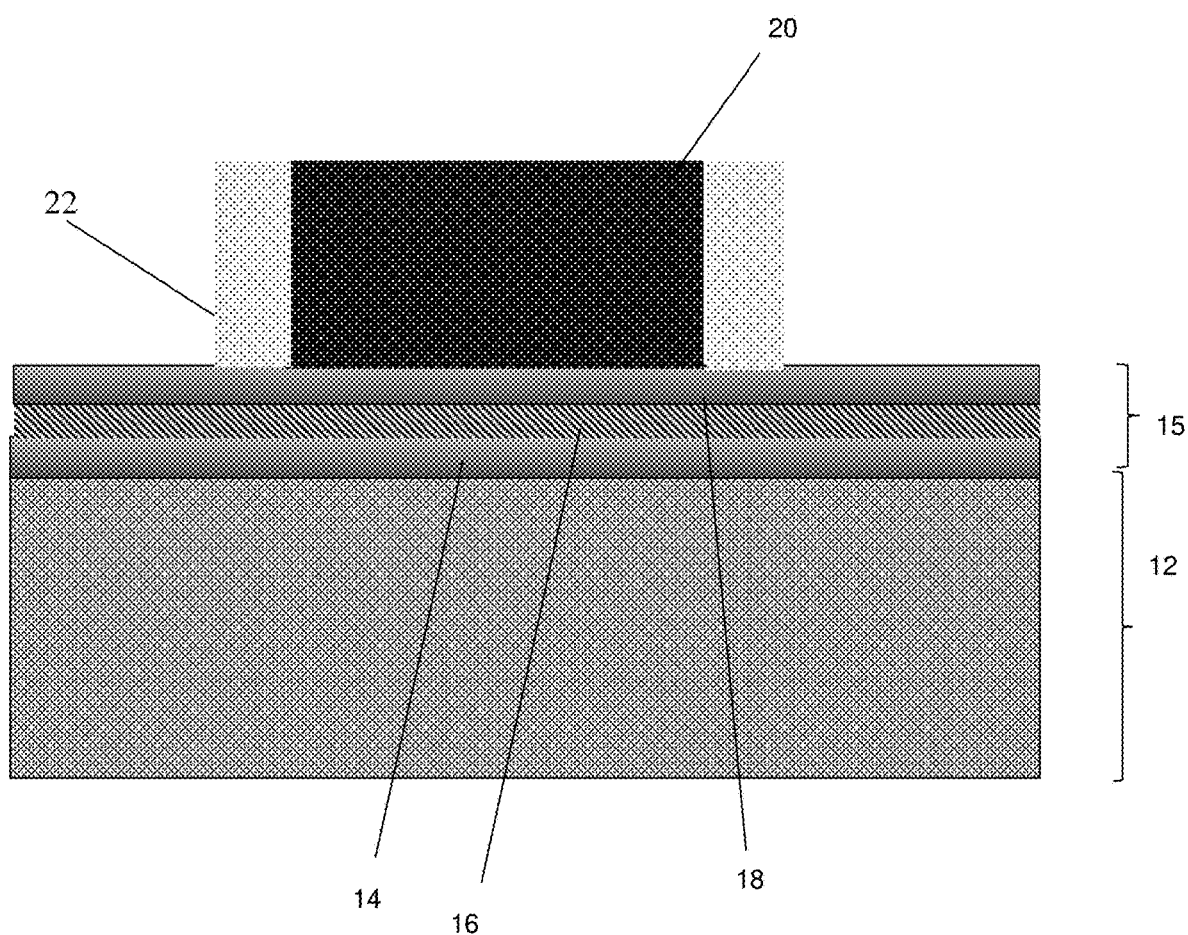
FIG. 2 shows dummy (sacrificial) material with sidewall spacers over an epitaxial material, amongst other features, and respective fabrication processes in accordance with aspects of the present disclosure.

As further shown in FIG. 2, a sacrificial material 20 may be formed over the semiconductor material 18. In embodiments, the sacrificial material 20 may be a polysilicon material, as an example. The sacrificial material 20 may be formed by a conventional deposition process, e.g., chemical vapor deposition (CVD), followed by a patterning process using conventional lithography and etching processes as further described herein. Sidewall spacers 22 may be formed on sidewalls of the patterned sacrificial material 20. In embodiments, the sidewall spacers 22 may comprise oxide and nitride deposited using a blanket deposition process, e.g., CVD, followed by an anisotropic etching process.

Figure 3:
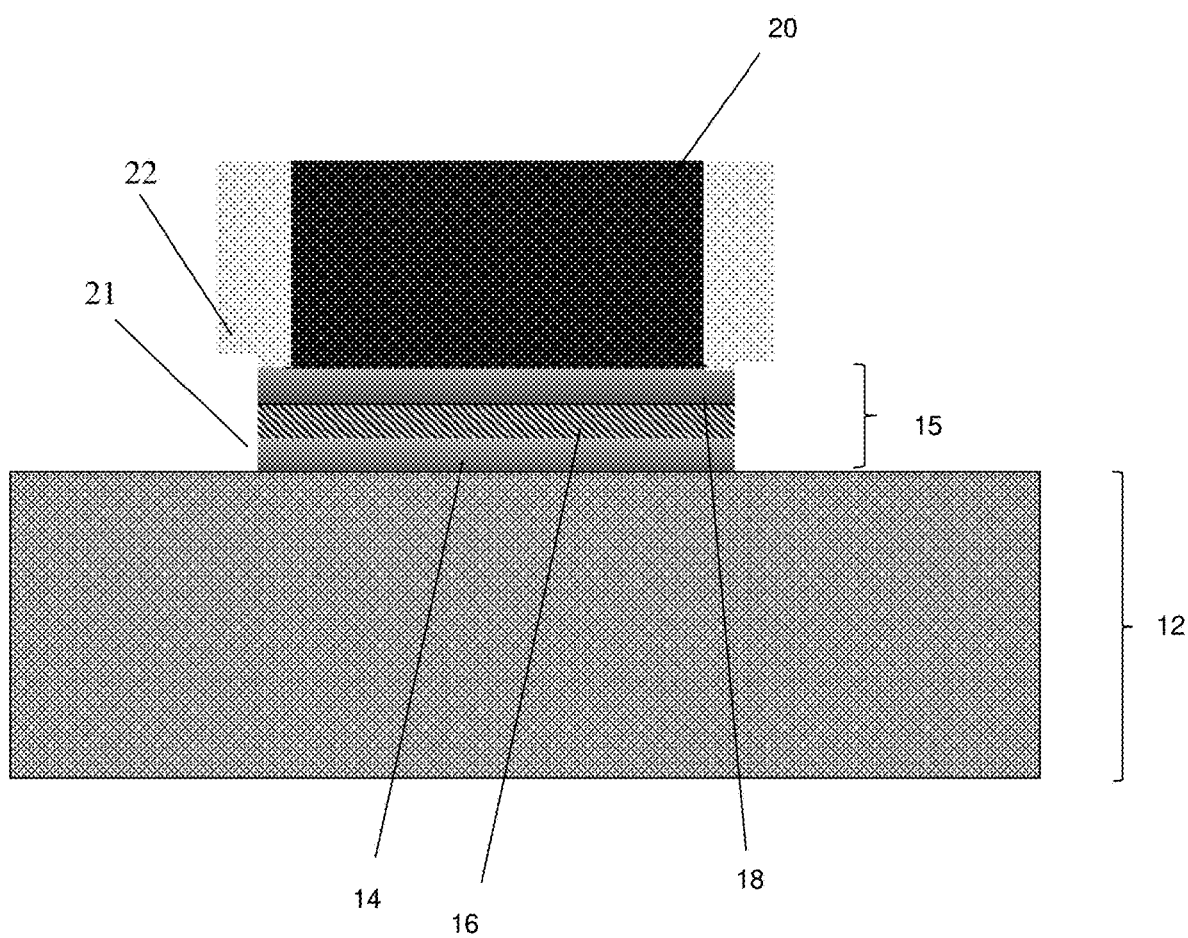
FIG. 3 shows a patterned stack of materials, amongst other features, and respective fabrication processes in accordance with aspects of the present disclosure.

In FIG. 3, the semiconductor materials 14, 16, 18 may be patterned to form a stack of materials 15 under the sacrificial material 20. The patterning may be a conventional lithography and etching processes, e.g., a self-aligned double patterning process (SADP). For example, a resist formed over the semiconductor material 18 is exposed to energy (light) to form a pattern (opening). An etching process with a selective chemistry, e.g., reactive ion etching (RIE), will be used to form the pattern, e.g., stack of materials 15, through the openings of the resist. The resist may be removed by a conventional oxygen ashing process or other known stripants. In optional embodiments, the etching process may include an over-etch to provide a recess or overhang 21 under the sidewall spacers 22.

Figure 4:
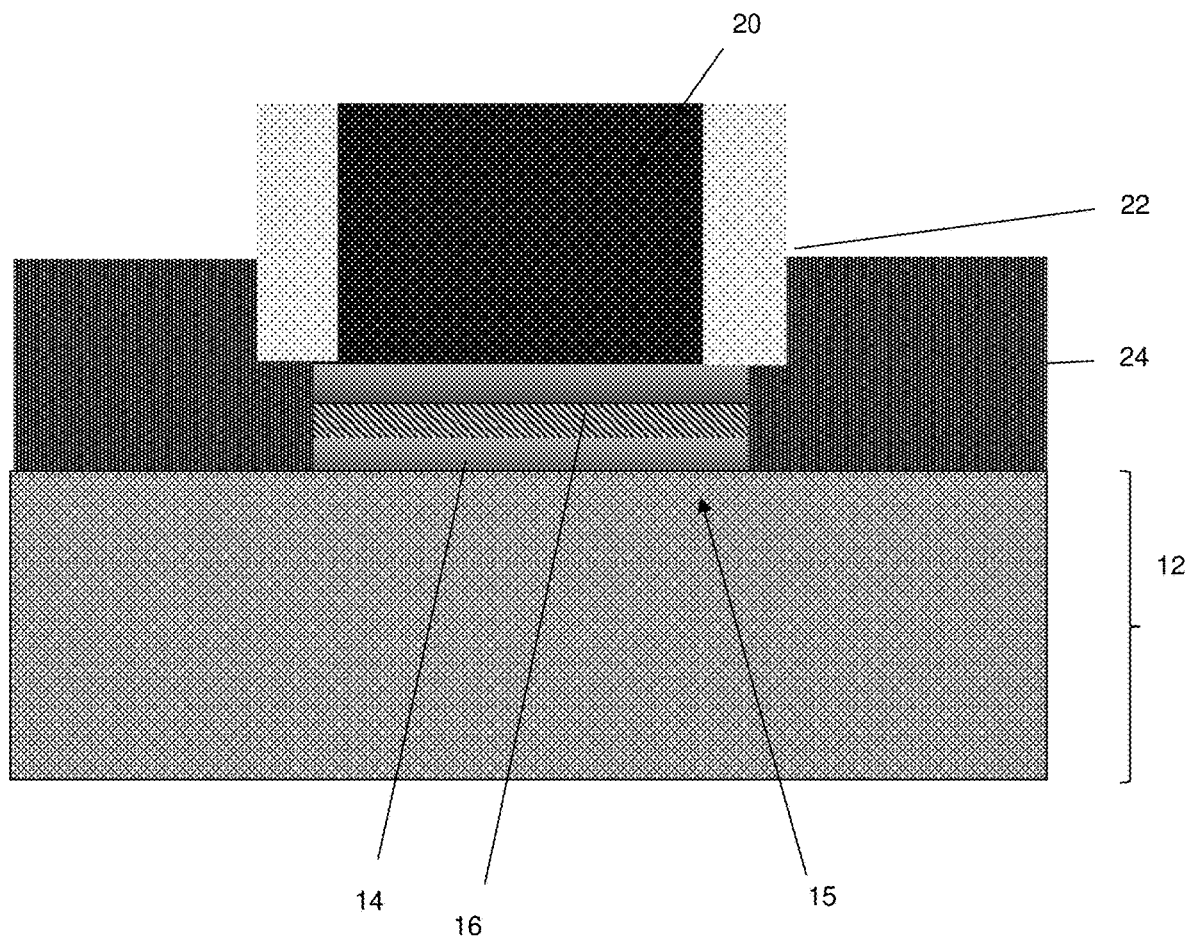
FIG. 4 shows collector regions, amongst other features, and respective fabrication processes in accordance with aspects of the present disclosure.

In FIG. 4, a semiconductor material 24 may be formed over the substrate 12 and in contact with the stack of materials 15 and, more specifically, in contact with semiconductor material 16 (e.g., collector region). The semiconductor material 24 may form collector regions (which contact to the collection region (e.g., semiconductor material 16) of the bipolar transistor.

In more specific embodiments, the semiconductor material 24 may be Si material, with a gradient concentration of n-doping. For example, the concentration of N-type dopants may comprise a lower concentration (N−) of dopant adjacent to the substrate 12 and the stack of materials 15, compared to a higher concentration (N+) at remaining locations. The semiconductor material 24 may also be n-doped polysilicon material. In either scheme, the semiconductor material 24 may be in-situ doped with the n-type dopant, e.g., arsenic, phosphorous, etc., to form the N+ and N− concentrations. In embodiments, the epitaxial semiconductor material 24 may be grown from the substrate 12, onto the sides of the sidewall spacers 22.

Figure 5:
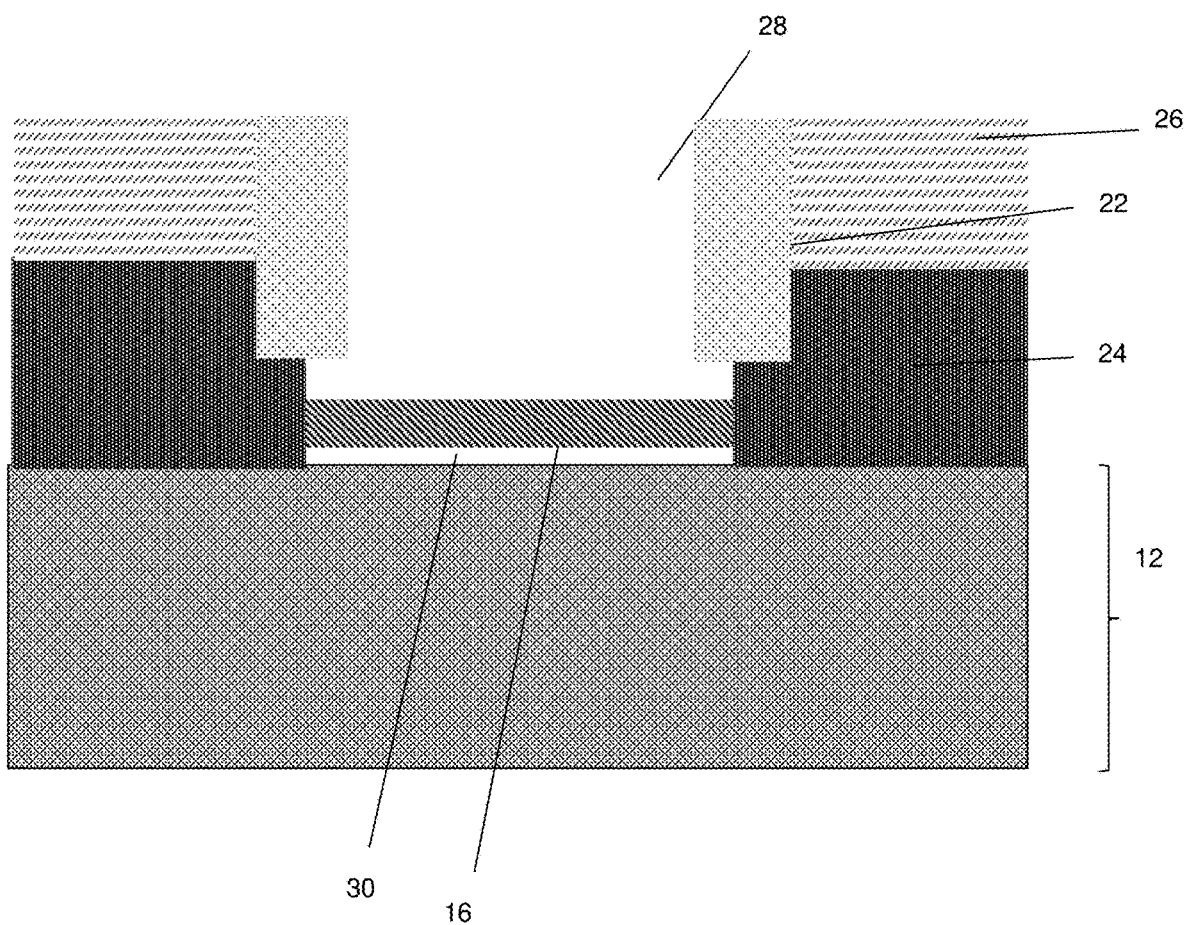
FIG. 5 shows an elongated collector region, amongst other features, and respective fabrication processes in accordance with aspects of the present disclosure.

As further shown in FIG. 5, an interlevel dielectric material 26 may be formed over the collector region, e.g., epitaxial semiconductor material 24. In embodiments, the interlevel dielectric material 26 may be a combination of nitride and oxide material deposited by a CVD process. Following the deposition process, the interlevel dielectric material 26 may be planarized by a chemical mechanical polishing (CMP) to expose the sacrificial material 20. The sacrificial material 20 may then be pulled out (e.g., removed) using etchants that are selective to the material of the sacrificial material, e.g., selective to polysilicon material. This will result in a trench 28 between the sidewall spacers 22.

The semiconductor materials 14, 18 may also be removed by a selective etching process to release the collector region, e.g., leaving the semiconductor material 16 intact between the collector regions 24. By way of example, the selective etching process uses an etch chemistry selective to SiGe, which will not attack the semiconductor material 16 or the material of the substrate 12. The removal of the semiconductor material 14 may leave a space 30 below the semiconductor material 16, e.g., between the substrate 12 and the semiconductor material 16. This will result in the semiconductor material 16 being a floating sheet with an elongated shape, e.g., nanowire, nanosheet, cylindrical, annular, etc., comprising a thickness of about 10 nm to about 25 nm, parallel to the surface of the substate 12.

Figure 6:
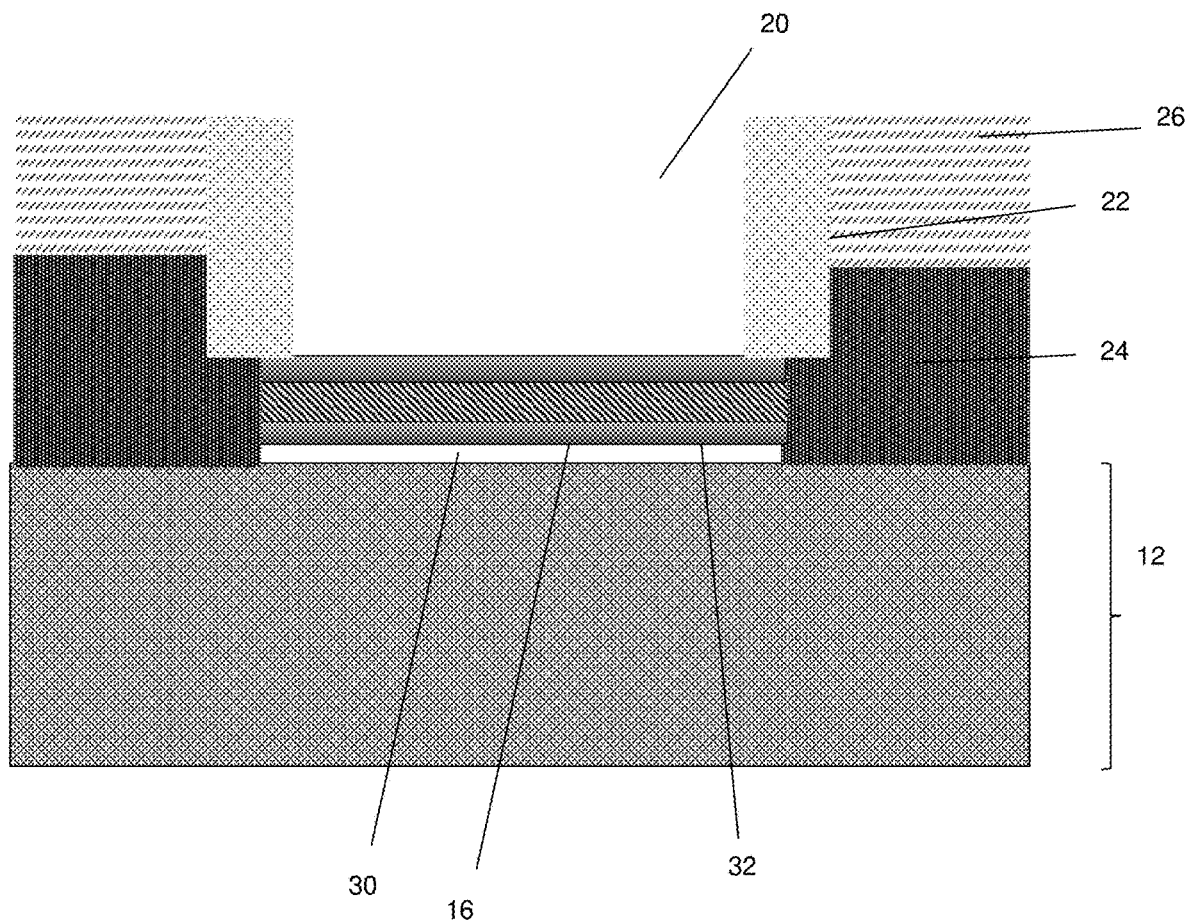
FIG. 6 shows an intrinsic base region around the elongated collector region, amongst other features, and respective fabrication processes in accordance with aspects of the present disclosure.

In FIG. 6, a semiconductor material 32 may be formed around the exposed semiconductor material 16. In embodiments, the semiconductor material 32 may be an intrinsic base region of the bipolar transistor. Also, in embodiments, the intrinsic base region extends parallel to a surface of the substrate 12 with the intrinsic base region surrounding the collector region along is elongated axis.

The semiconductor material 32 may be epitaxially grown around the exposed semiconductor material 16. Moreover, the semiconductor material 32 may be SiGe material formed by an epitaxial growth process with an in-situ doping using a p-type dopant, e.g., boron. In embodiments, the SiGe material may have a gradient profile of Ge material, with a higher concentration of Ge adjacent to the exposed semiconductor material 16. Also, as the semiconductor material 24 has a graded n-type doping concentration, the N-doping adjacent to the SiGe material will prevent leakage and lower the collector to base breakdown.

Figure 7:
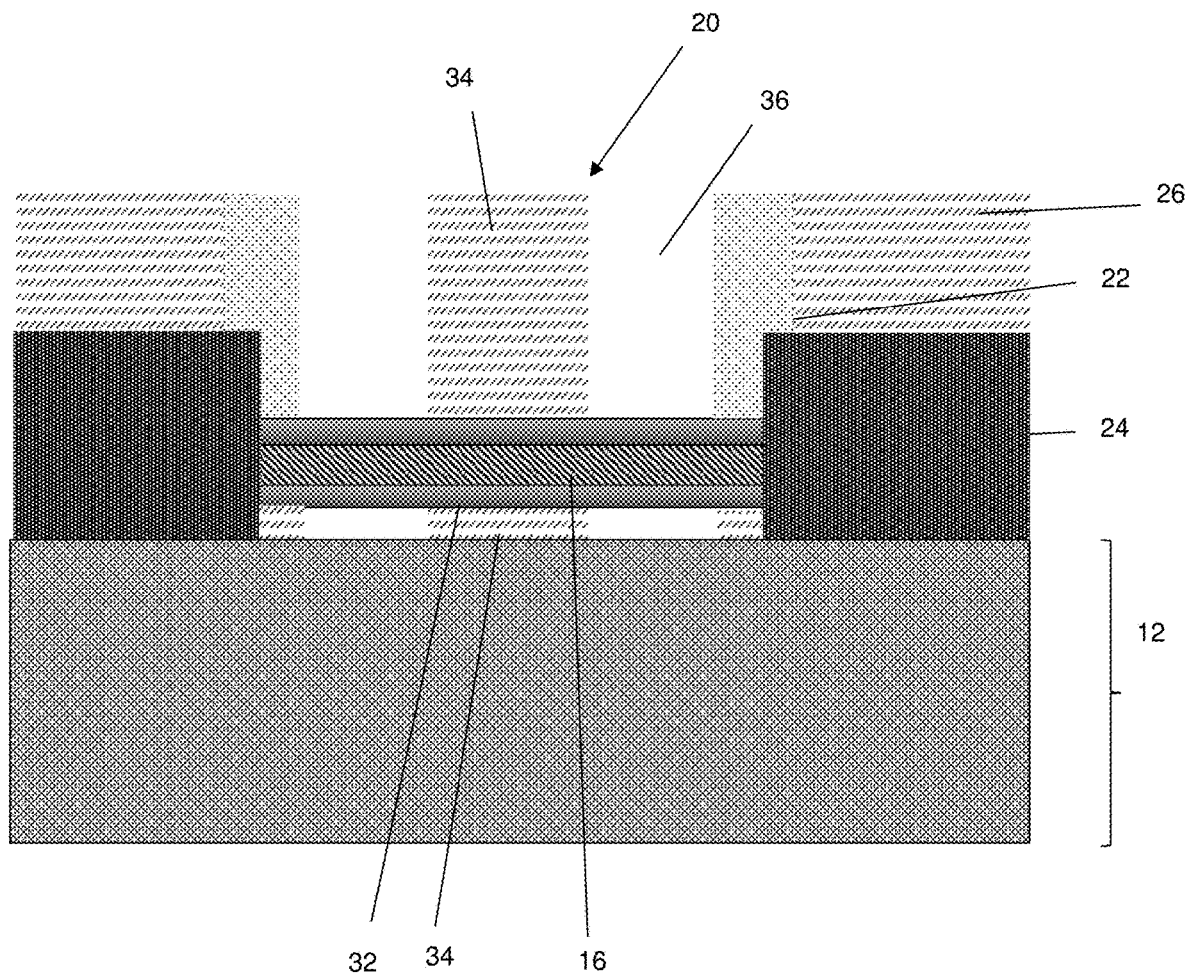
FIG. 7 shows trenches exposing the intrinsic base region around the elongated collector region, amongst other features, and respective fabrication processes in accordance with aspects of the present disclosure.

FIG. 7 shows an interlevel dielectric material 34 within the opening 20. In embodiments, the interlevel dielectric material 34 may be a nitride material or oxide/nitride, as examples. The interlevel dielectric material 34 may be deposited within the opening 20 by a conventional deposition process, e.g., CVD, followed by a planarization process. The interlevel dielectric material 34 may be partially removed, e.g., etched, to form trenches 36 adjacent to the sidewall spacers 22. The interlevel dielectric material 34 may be removed by a lithography and etching process as is known to those of skill in the art. In this way, the semiconductor material 32 and substrate 12 may be exposed.

Figure 8:
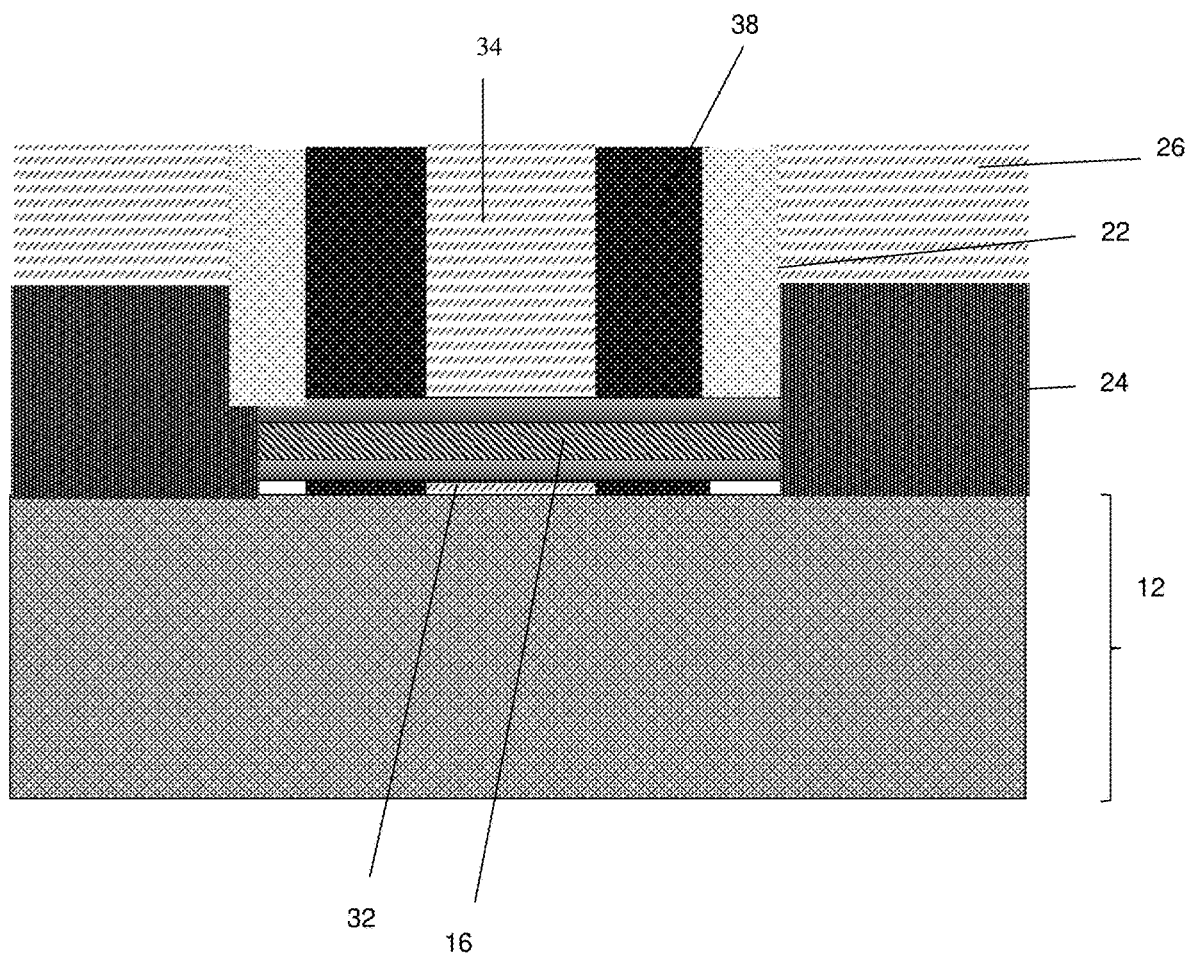
FIG. 8 shows an extrinsic base region around intrinsic base region, amongst other features, and respective fabrication processes in accordance with aspects of the present disclosure.
Figure 9:
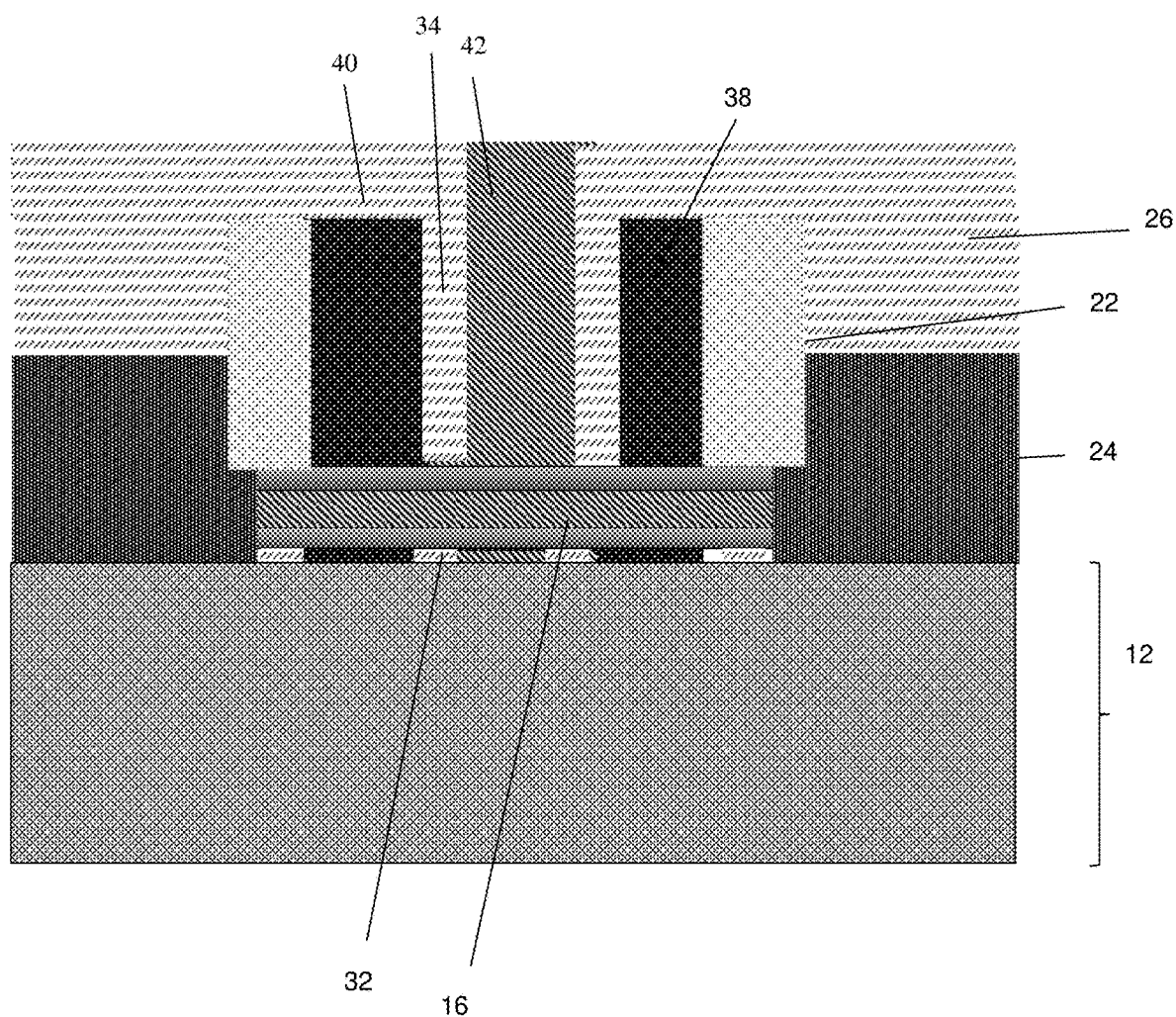
FIG. 9 shows an emitter region, amongst other features, and respective fabrication processes in accordance with aspects of the present disclosure.

In FIG. 8, semiconductor material 38 may be formed within the trenches 36. As should be recognized by those of skill in the art, the semiconductor material 38 may be the extrinsic base region (vertically extending upwards above the substrate 12) of the bipolar transistor, which is around the intrinsic base region and collector region. In embodiments, the semiconductor material 38 may be in contact with the substate 12 and the semiconductor material 32, e.g., intrinsic base region. More specifically, the semiconductor material 38 may extend fully around the semiconductor material 32, e.g., intrinsic base region, and the semiconductor material 16, e.g., collector region. The semiconductor material 36 may be epitaxially grown with an in-situ doping process, e.g., p-type dopant such as boron, on the semiconductor material 32 and substrate 12. In embodiments, the semiconductor material 38 may be SiGe material, Si material or poly silicon material. And In FIG. 9, additional interlevel dielectric material 40 may be formed over the semiconductor material 38 and interlevel dielectric materials 34, 26. In embodiments, the interlevel dielectric material 40 may be a nitride or oxide/nitride material deposited by a conventional deposition process, e.g., CVD. A trench may be formed within the interlevel dielectric material 34, 40 by removing such material to expose the semiconductor material 32 and substrate 12. An epitaxial semiconductor material 42 may be formed within the trench to contact the exposed the semiconductor material 32. In embodiments, the semiconductor material 38 may be Si material epitaxially grown with an in-situ doping process, e.g., n-type dopant such as arsenic. It is noted that the semiconductor material 42 is isolated from the semiconductor material 38 by the interlevel dielectric material 34. And as should be recognized by those of skill in the art, the semiconductor material 42 may be the emitter region (vertically extending upwards above the substrate 12) of the bipolar transistor, which extends above the semiconductor material 38, e.g., extrinsic base region.

Figure 10:
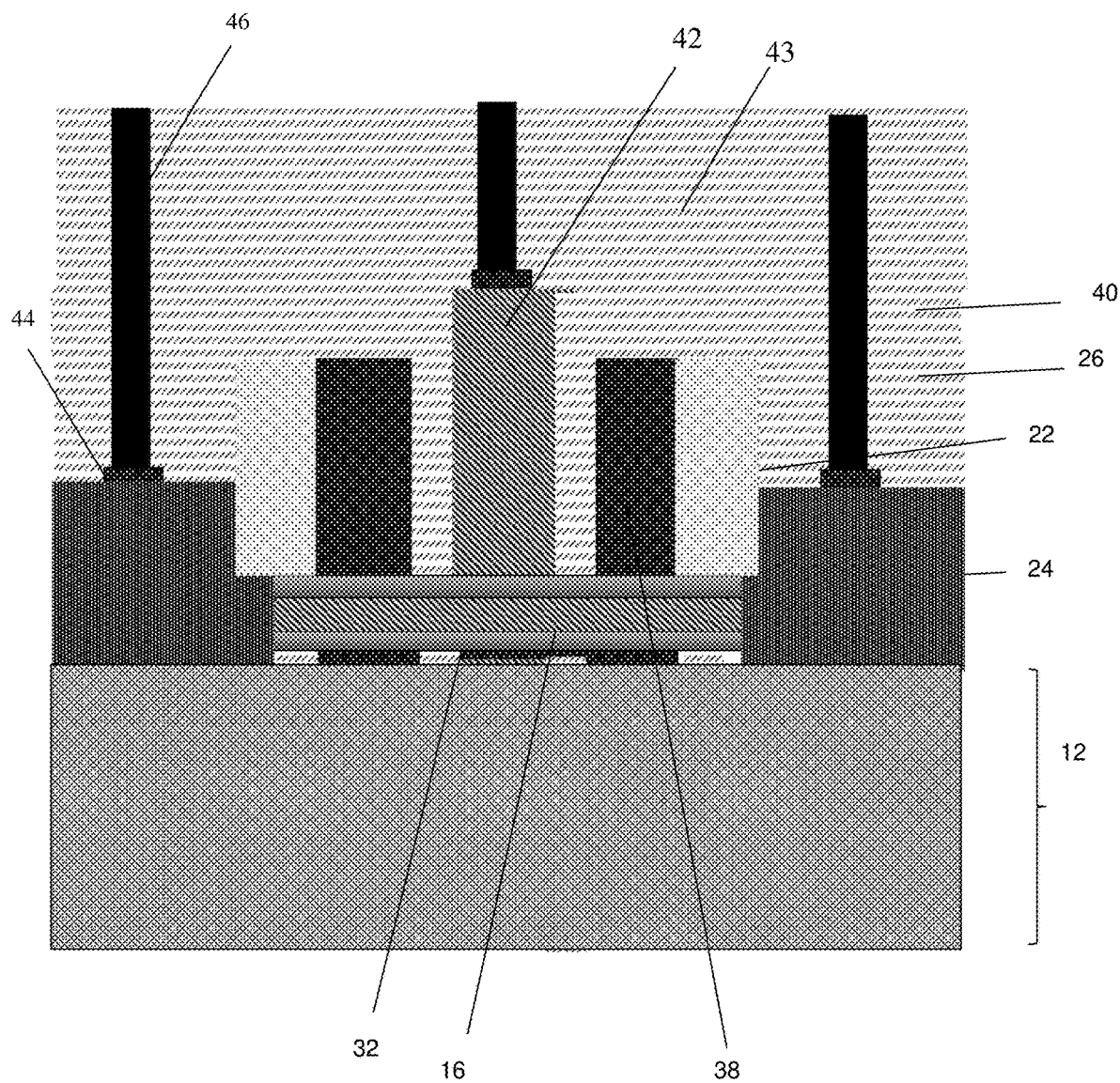
FIG. 10 shows contacts, amongst other features, and respective fabrication processes in accordance with aspects of the present disclosure.

Referring to FIG. 10, contacts 46 may be formed to the collector region, e.g., semiconductor material 24, extrinsic base region, e.g., semiconductor material 38 (shown in FIG. 10) and the emitter region, e.g., semiconductor material 42. More specifically, in FIG. 10, to form the contacts 46, vias are formed in interlevel dielectric material (e.g., stack of materials 43, 40, 26) to expose surfaces of the semiconductor materials 24, 38, 43. A silicide process may be performed on the exposed semiconductor materials 24, 38, 43 to form silicide contacts 44. As should be understood by those of skill in the art, the silicide process begins with deposition of a thin transition metal layer, e.g., nickel, cobalt or titanium, over the semiconductor materials 24, 38, 43. After deposition of the material, the structure is heated allowing the transition metal to react with exposed silicon (or other semiconductor material as described herein) forming a low-resistance transition metal silicide. Following the reaction, any remaining transition metal is removed by chemical etching, leaving silicide contacts 44.

Conductive material may then be deposited within the vias, over the silicide contacts 44, to form the contacts 46. The conductive material may be tungsten or aluminum, which may also include a barrier liner material. Any excess conductive material on the surface of the interlevel dielectric material 43 may be removed by a conventional CMP process.

Figure 11:
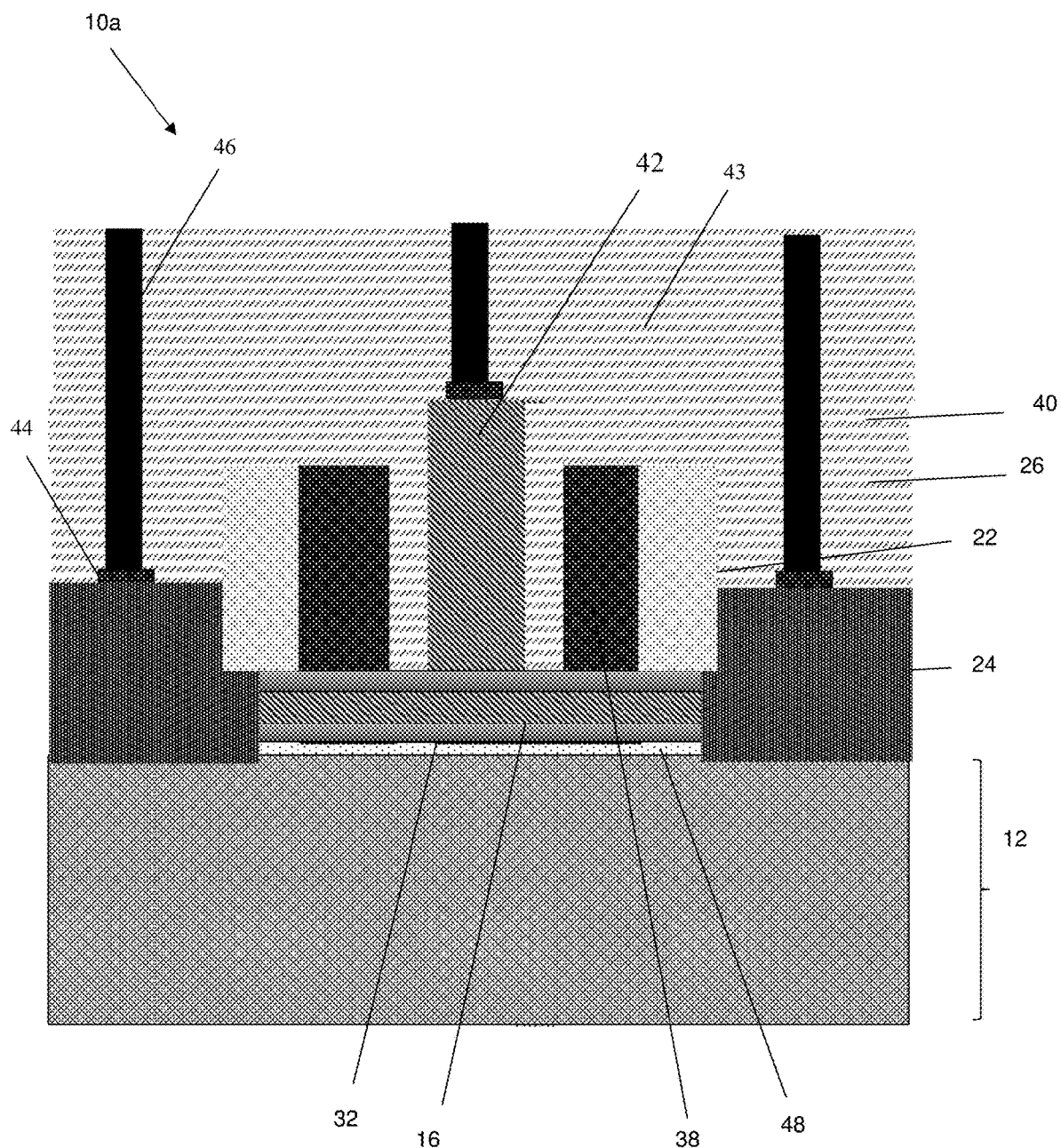
FIG. 11 shows an alternative bipolar transistor layout, and respective fabrication processes in accordance with aspects of the present disclosure.

FIG. 11 shows an alternative layout of the bipolar transistor in accordance with aspects of the present disclosure. In this layout 10a, an insulator material 48 is completely under the semiconductor material 38, e.g., intrinsic base region. More specifically, insulator material 48 is between the semiconductor material 38, e.g., intrinsic base region, and the substrate 12. In this way, the insulator material 48 isolates the extrinsic base region 38 and the emitter region 42 from the substrate 12. Moreover, the insulator material 48 may provide additional support for the semiconductor material 38, e.g., intrinsic base region. In addition, in this configuration, there will be no junction between the semiconductor material 38, e.g., intrinsic base region and the substrate 12.

Figure 12:
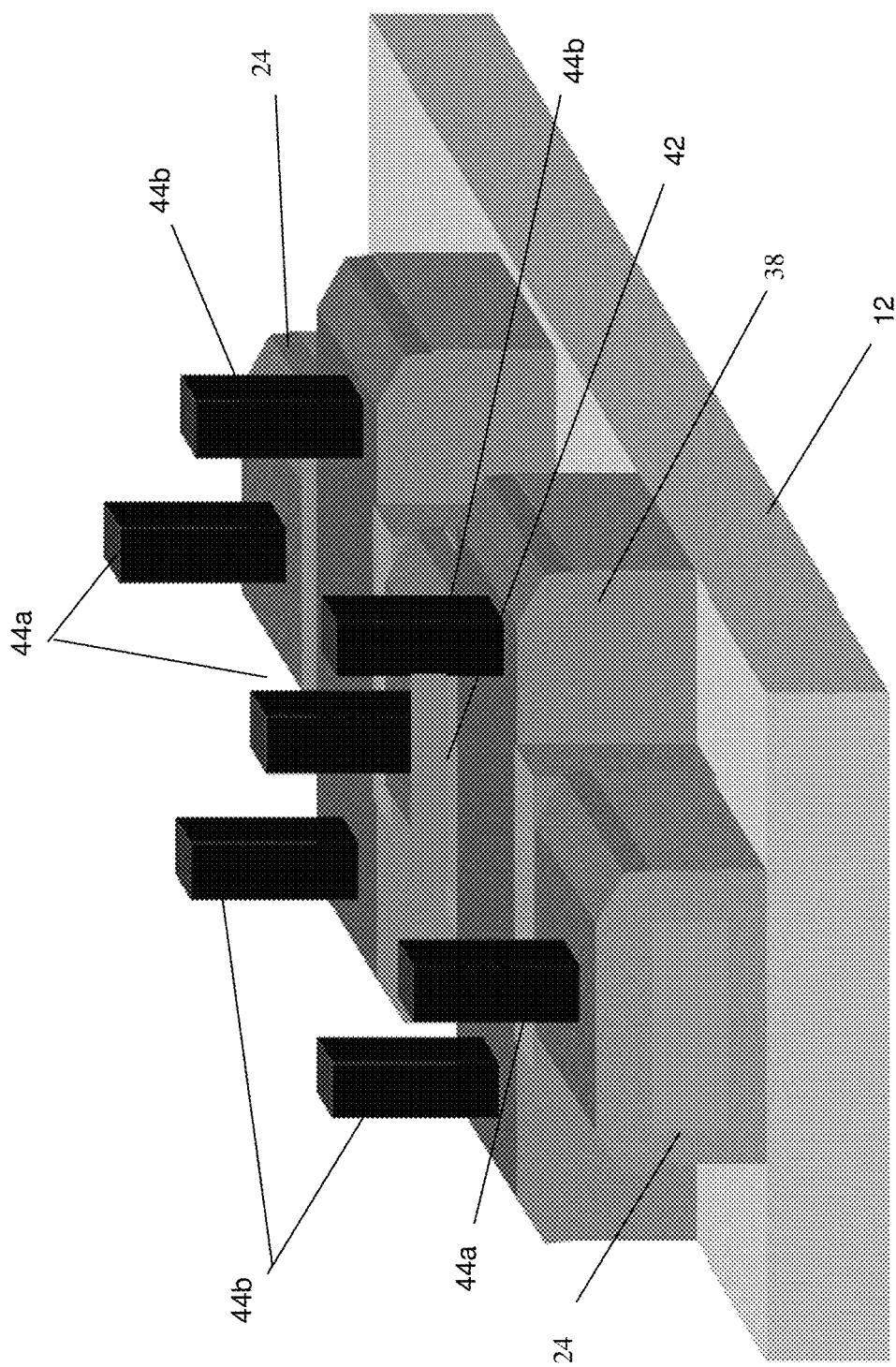
FIG. 12 shows a three-dimensional view of the bipolar transistor of FIG. 10.

FIG. 12 is a three-dimensional view of the bipolar transistor of FIG. 8, for example. As shown in this representation, the contacts 44a for the emitter region 42 and collector region 24 are in alignment; whereas the contacts 44b for the extrinsic base region 38 are offset from the contacts 44a of the emitter region 42 and collector region 44.

The transistors can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multichip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
a substate material;
a collector region parallel to and above the substrate material;
an intrinsic base region surrounding the collector region;
an emitter region above the intrinsic base region;
an extrinsic base region contacting the intrinsic base region; and
collector contact regions connecting to ends of the collector region.

2. The structure of claim 1, wherein the collector region comprises one of an elongated shape, nanowire, a nanosheet, annular, and a cylindrical shape.

3. The structure of claim 1, wherein the collector region and the intrinsic base region extend parallel to a surface of the substrate material and the intrinsic base region surrounds the collector region along an elongated axis.

4. The structure of claim 3, wherein the emitter region surrounds the intrinsic base region, the extrinsic base region surrounds the intrinsic base region, and both the intrinsic base region and the extrinsic base region contact the substrate material.

5. The structure of claim 4, further comprising insulator material separating the extrinsic base region from the collector contact region on sides of the collector region and further separating the extrinsic base region from the emitter region.

6. The structure of claim 5, wherein the emitter region and the extrinsic base region vertically extend upwards from the substrate material.

7. The structure of claim 1, wherein the intrinsic base region comprises SiGe material and the collector region comprises Si material.

8. A structure comprising:
a substrate material;
a collector region parallel to and above the substrate material;
an intrinsic base region surrounding the collector region;
an emitter region above the intrinsic base region;
an extrinsic base region contacting the intrinsic base region; and
insulator material separating the substate material from the collector region, the intrinsic base region, the extrinsic base region and the emitter region.

9. A structure comprising:
a collector region comprising a first semiconductor material and extending parallel to a surface of an underlying substrate;
an intrinsic base region comprising a second semiconductor material and extending around the collector region;
an extrinsic base region contacting the intrinsic base region and extending vertically upward from the underlying substrate; and
an emitter region contacting the intrinsic base region and extending vertically upward from the underlying substrate,
wherein the extrinsic base region and the emitter region surround the intrinsic base region.

10. The structure of claim 9, wherein the extrinsic base region and the emitter region are separated by insulator material.

11. The structure of claim 9, further comprising a collector contact region contacting ends of the collector region and separated from the extrinsic base region by sidewall spacers.

12. The structure of claim 9, wherein the first semiconductor material comprises Si material and the second semiconductor material comprises SiGe material.

13. The structure of claim 12, wherein the SiGe material comprises a graded concentration of Ge material.

14. The structure of claim 13, wherein the collector region comprises a gradient dopant concentration.

15. The structure of claim 9, wherein the intrinsic base region surrounds the collector region along an elongated axis of the collector region.

16. A structure comprising:
a collector region comprising a first semiconductor material and extending parallel to a surface of an underlying substrate;
an intrinsic base region comprising a second semiconductor material and extending around the collector region;
an extrinsic base region contacting the intrinsic base region and extending vertically upward form the underlying substrate; and
an emitter region contacting the intrinsic base region and extending vertically upward from the underlying substrate,
wherein the extrinsic base region and the emitter region are separated from the underlying substate material by an insulator material.

17. A structure comprising:
a collector region comprising a first semiconductor material and extending parallel to a surface of an underlying substrate;
an intrinsic base region comprising a second semiconductor material and extending around the collector region;
an extrinsic base region contacting the intrinsic base region and extending vertically upward from the underlying substrate; and
an emitter region contacting the intrinsic base region and extending vertically upward from the underlying substrate,
wherein the extrinsic base region and the emitter region surround the intrinsic base region.

18. A method comprising:
forming a collector region parallel to, separated from and above a substrate material;
forming an intrinsic base region surrounding the collector region;
forming an emitter region above the intrinsic base region; and
forming an extrinsic base region contacting the intrinsic base region.

19. The method of claim 18, wherein the extrinsic base region and the emitter region surround the intrinsic base region.

20. The method of claim 18, further comprising forming an insulator layer, wherein the extrinsic base region and the emitter region are separated from the substate material by the insulator material.

* * * * *